(12) United States Patent
Sutton et al.

(10) Patent No.: US 7,686,925 B2
(45) Date of Patent: Mar. 30, 2010

(54) SILICON ALLOY COATING OF INSULATED WIRE

(75) Inventors: Samuel C. Sutton, Redondo Beach, CA (US); Michael W. Mills, Torrance, CA (US); Craig R. Wilkinson, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 1000 days.

(21) Appl. No.: 11/418,271

(22) Filed: May 4, 2006

(65) Prior Publication Data

US 2007/0256928 A1 Nov. 8, 2007

(51) Int. Cl.
*C23C 14/34* (2006.01)

(52) U.S. Cl. .......................... 204/192.14; 204/192.12; 204/192.15; 204/298.24

(58) Field of Classification Search ............ 204/192.14, 204/298.24, 192.12, 192.15
See application file for complete search history.

(56) References Cited

U.S. PATENT DOCUMENTS

| 4,822,642 A | 4/1989 | Cabrera et al. |
| 6,279,857 B1 | 8/2001 | Roth |

*Primary Examiner*—Rodney G McDonald
(74) *Attorney, Agent, or Firm*—Carmen Patti Law Group, LLC

(57) ABSTRACT

Method and apparatus for sputter coating an insulated wire with a silicon and metal alloy, to provide the wire with sufficient surface conductivity to protect against build-up of electrostatic charge. A sputtering target of silicon has a metal plate positioned close enough to the sputtering site on the target to permit metal atoms to be dislodged by sputtered silicon, and deposited with the silicon to form an alloy. In the disclosed form of the invention, the wire is insulated with a polyimide material and the metal alloyed with silicon in the sputtered coating is stainless steel.

11 Claims, 1 Drawing Sheet

SILICON ALLOY COATING OF INSULATED WIRE

BACKGROUND OF THE INVENTION

This invention was made with Government support under contract. The Government has certain rights in this invention.

This invention relates generally to deposition processes and, more particularly, to techniques for coating insulated wires for use in a space environment. A common problem in spacecraft structures, such as solar panels, is the build-up of electrostatic charge. Uncontrolled discharge of the build-up can damage electronic and other components. Electrostatic discharge (ESD) protection is, therefore, a significant consideration in spacecraft design. Typically, ESD protection takes the form of a conductive coating that effects continuous electrostatic discharge and avoids build up of charge on sensitive components. For solar panels, this ESD protection coating may be a silicon coating with the desired resistivity.

With the development of multi-junction solar cells, where each cell has multiple photovoltaic cells at different levels in the cell structure, the problem of ESD has been has become and even greater concern because multi-junction cells have a higher sensitivity to ESD. Moreover, it has become apparent that there is also a need to provide ESD protection for insulated hookup wires connecting multiple solar cells in a solar cell array or panel. To some degree, electrostatic charge buildup can occur in the wires as well as on the panel itself. Prior to this invention, solar panel hookup wires have been insulated with a polyimide material, such as Kapton, which, as an insulator, provides no significant ESD protection, and is totally inadequate for protection of wiring for multi-junction solar panels. Accordingly, there is still a need to provide ESD protection for insulated wires, as used in solar panel interconnections. The present invention is directed to this end.

SUMMARY OF THE INVENTION

The present invention resides in a technique for coating insulated wires with a silicon alloy that provides an ideal electrical resistivity for conduction of electrostatic charge that would otherwise accumulate on each wire. Briefly, and in general terms, the method of the invention comprises the steps of sputtering a silicon and metal alloy onto an insulated wire; and passing the wire continuously through a sputtering chamber to provide continuous coating of the wire.

More specifically, the sputtering step comprises positioning a silicon target in the sputtering chamber; and sputtering silicon atoms from the target onto the insulated wire. The sputtering step further comprises positioning a metal plate on the silicon target; and depositing with the silicon a number of metal atoms dislodged from the metal plate by interaction with sputtered silicon atoms, wherein an alloy of silicon and the metal is deposited on the insulated wire.

In the invention as disclosed, the metal may be iron, steel, stainless steel, or any other suitable conductive metal, and the insulated wire has a polyimide insulation, such as Kapton.

In terms of a novel apparatus, the invention comprises a sputtering chamber; means for passing an insulated wire continuously through the sputtering chamber; a silicon target positioned in the sputtering chamber; and a metal target positioned in the sputtering chamber close to a sputtering site on the sputtering target. Atoms are dislodged from the metal plate by interaction with sputtered silicon atoms, and a silicon and metal alloy is sputtered onto the insulated wire to provide continuous coating of the wire.

It will be appreciated from the foregoing that the present invention represents a significant advance in the field of ESD protection of insulated wires. In particular, the invention provides a sputtered coating of a silicon alloy over an insulated wire. Other aspects and advantages of the invention will become apparent from the following more detailed description, taken in conjunction with the accompanying drawings.

DETAILED DESCRIPTION OF THE INVENTION

Figure 1:
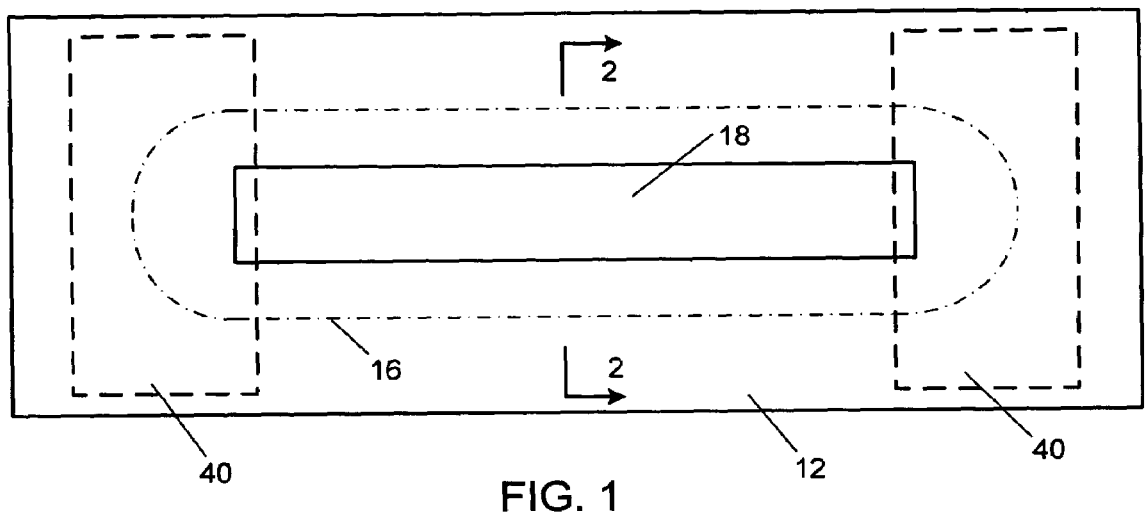
FIG. 1 is diagrammatic plan view of a silicon target used in a process to sputter silicon alloyed with a conductive metal, onto a continuous insulated wire.

As shown in the drawings for purposes of illustration, the present invention is concerned with a technique for coating an already insulated conductor wire for purposes of providing electrostatic discharge (ESD) protection for the wire when installed in an environment subject to electrostatic charge build-up. In the past, germanium has been used to coat thermal blankets on spacecraft, but has proved to pose difficulties because of it tendency to absorb moisture when stored over a time. Coating surfaces with silicon for ESD protection has met with only limited success because silicon is not conductive enough to protect a panel of multi-junction cells, which are highly sensitive to ESD.

Figure 2:
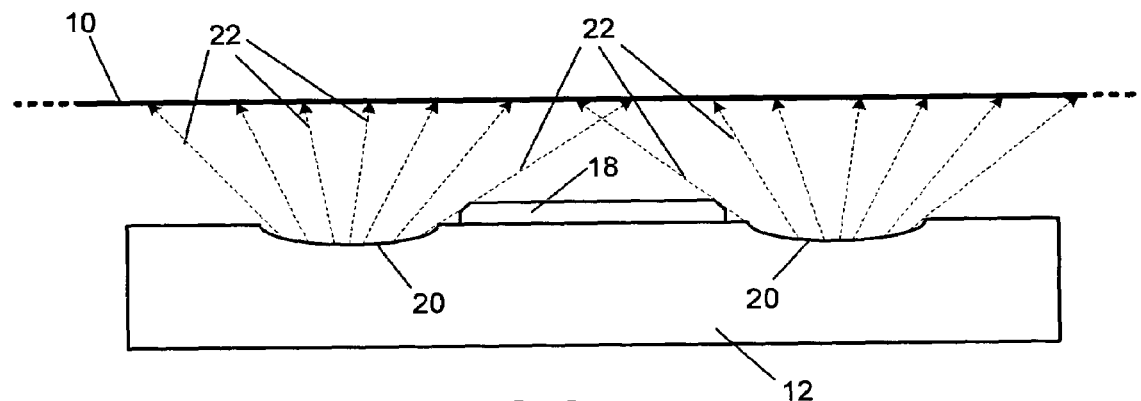
FIG. 2 is a diagrammatic cross-section view taken along the line 2-2 in FIG. 1.
Figure 3:
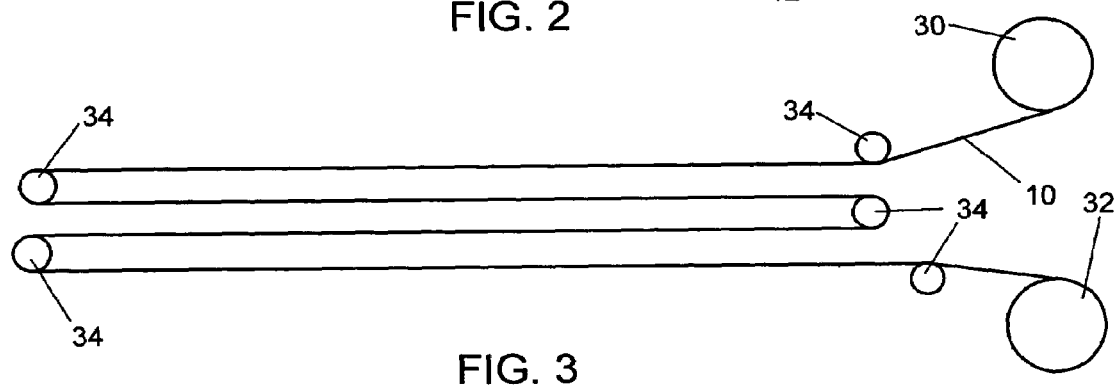
FIG. 3 is a diagrammatic view showing how the continuous insulated wire is fed in multiple passes through the apparatus of the invention.

In accordance with the invention, an insulated wire 10 is sputter-coated with an alloy of silicon, which provides a desired resistivity needed for ESD protection. In the apparatus of the invention, as shown in FIGS. 1-3, coating of the wire 10 is effected by a sputtering process that takes place within a vacuum chamber (not shown), in which plasma of atoms and ions is formed. An elongated sputtering target 12 of silicon is secured in the vacuum chamber and is electrically biased with a negative voltage. Positive ions of, for example, argon, in the plasma are electrically attracted toward the target 12 and are focused by a magnetic field along an elongated oval track, the centerline of which is indicated by the broken line 16. Therefore, most of the positive ions accelerated toward the target 12 impact the target in a band centered on the line 16. Impacting ions displace atoms of silicon from the target 12 and some of these sputtered atoms are deposited on the wire 10, over its insulating layer of Kapton. In accordance with an important aspect of the invention, a plate 18 of metal to be alloyed with the sputtered silicon is secured to the target 12 in a position between the two parallel portions of the band 16. As best shown in FIG. 2, some of the sputtered silicon atoms will take a path that impacts edges of the metal plate 18 and dislodges atoms of the metal. Some of these secondarily sputtered metal atoms will also be deposited on the wire 10 with sputtered silicon atoms, forming a silicon alloy coating. The metal plate 18 may be a pure metal, such as iron, or may itself be an alloy, such as stainless steel. In the presently preferred embodiment, the metal plate 18 is of 15-5 stainless steel (a conventional designation indicating that the stainless steel has approximately 15% chromium and approximately 5% nickel).

As best shown in FIG. 2, because the target 12 is sputtered in the region of the band 16 (FIG. 1), the target tends to erode in that region, as indicated by the troughs 20 on each side of the metal plate 18. The dotted lines 22 indicate possible paths of silicon atoms sputtered from the target 12. Some of the sputtered atoms impact the metal plate 18 and cause atoms of the metal to be deposited on the wire 10 with the sputtered silicon atoms.

FIG. 3 shows an arrangement for feeding the wire 10 across the sputtering target 12. The arrangement includes a feed spool 30, a take-up spool 32 and a plurality of idler pulleys 34 over which the wire 10 passes in such a way as to provide multiple passes of the wire across the sputtering target 12. By way of example, the wire 10 is shown as passing across the sputtering target four times before reaching the take-up spool 32. Preferably, the wire 10 is also twisted about its longitudinal axis as it proceeds across the sputtering target 12, to ensure that the sputtered coating is applied as uniformly as possible. Because the sputtering rate tends not to be uniform at the ends of the band 16, it is preferable to install shields 40 over these areas.

As the target 12 becomes more eroded over time, and the troughs 20 become more pronounced, the metal plate 18 may need to be replaced in order to maintain a desired percentage of metal in the deposited silicon alloy. For good ESD protection, the sheet resistance of the surface coating should ideally be in the range of $10^6$ to $10^8$ ohms (usually referred to as ohms per square). By replacing the metal plate 18 as required, the conductivity of the coating can be maintained over conveniently long run lengths of insulated wire, preferably more than approximately 100 ft (30 m).

It will be appreciated from the foregoing that the present invention represents a significant improvement in the manufacture of insulated wires for space applications, such as hook-up wiring for solar panels. In particular, the invention provides a technique for protecting insulated wires, such as Kapton insulated wires, from ESD. The applied coating of a silicon alloy is selected to be conductive enough to prevent significant electrostatic charge build-up on the wire. It will also be appreciated that, although a specific example of the method and apparatus for the invention has been described in detail by way of illustration, various modifications may be made without departing from the spirit and scope of the invention. Accordingly, the present invention should not be limited except as by the appended claims.

The invention claimed is:

1. A method for coating insulated wires to provide protection against electrostatic discharge (ESD), the method comprising:
   sputtering an alloy comprised of silicon and a metal onto an insulated wire; and
   passing the wire continuously through a sputtering chamber to provide continuous coating of the wire.

2. A method as defined in claim 1, wherein the sputtering step comprises:
   positioning a silicon target in the sputtering chamber; and
   sputtering silicon atoms from the target onto the insulated wire.

3. A method as defined in claim 2, wherein the sputtering step further comprises:
   positioning a metal plate on the silicon target; and
   depositing, with the sputtered silicon atoms, metal atoms dislodged from the metal plate by interaction with sputtered silicon atoms, wherein an alloy of silicon and the metal is deposited as the coating.

4. A method as defined in claim 3, wherein the metal is selected from the group consisting of iron, steel and stainless steel.

5. A method as defined in claim 3, wherein the insulated wire has a polyimide insulation.

6. A method as defined in claim 5, wherein the insulated wire has Kapton insulation.

7. A method as defined in claim 3, wherein the step of passing the wire through the sputtering chamber comprises repeatedly passing the wire through the chamber to obtain a coating of desired thickness and uniformity.

8. Apparatus for coating insulated wires to provide protection against electrostatic discharge (ESD), the apparatus comprising:
   a sputtering chamber;
   means for passing an insulated wire continuously through the sputtering chamber;
   a silicon target positioned in the sputtering chamber; and
   a metal target positioned in the sputtering chamber close to a sputtering site on the sputtering target, wherein a number of metal atoms are dislodged from the metal plate by interaction with sputtered silicon atoms;
   and wherein an ahoy comprised of silicon and a metal is sputtered onto the insulated wire to provide continuous coating of the wire.

9. Apparatus as defined in claim 8, wherein the metal is selected from the group consisting of iron, steel and stainless steel.

10. Apparatus as defined in claim 8, wherein the insulated wire has Kapton insulation.

11. Apparatus as defined in claim 8, wherein the means for passing the wire through the sputtering chamber comprises a plurality of spools and pulleys for repeatedly passing the wire through the chamber to obtain a coating of desired thickness and uniformity.

\* \* \* \* \*